(12) United States Patent
Hong et al.

(10) Patent No.: US 11,455,006 B2
(45) Date of Patent: Sep. 27, 2022

(54) DISPLAY DEVICE

(71) Applicant: SAMSUNG DISPLAY CO., LTD., Yongin-si (KR)

(72) Inventors: Wonki Hong, Yongin-si (KR); Hyungchul Kim, Yongin-si (KR); Jongin Baek, Yongin-si (KR); Donghwan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 8 days.

(21) Appl. No.: 17/204,012

(22) Filed: Mar. 17, 2021

(65) Prior Publication Data
US 2022/0091632 A1 Mar. 24, 2022

(30) Foreign Application Priority Data
Sep. 21, 2020 (KR) .................. 10-2020-0121796

(51) Int. Cl.
*G06F 1/16* (2006.01)
*H01L 27/32* (2006.01)

(52) U.S. Cl.
CPC .......... *G06F 1/1616* (2013.01); *G06F 1/1643* (2013.01); *H01L 27/323* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,691,513 A | * | 11/1997 | Yamamoto | G06F 3/046 345/173 |
| 7,623,120 B2 | | 11/2009 | Liu et al. | |
| 8,115,738 B2 | * | 2/2012 | Ito | G06F 1/1616 345/173 |
| 8,695,441 B2 | | 4/2014 | Kim et al. | |
| 8,770,035 B2 | | 7/2014 | Yamada et al. | |
| 9,285,941 B2 | * | 3/2016 | Lee | G06F 3/046 |
| 9,423,891 B2 | * | 8/2016 | Kelso | G06F 1/1616 |
| 9,619,726 B2 | * | 4/2017 | Inaba | G06F 3/03545 |
| 9,678,604 B2 | * | 6/2017 | Lee | G06F 3/046 |
| 9,823,797 B2 | | 11/2017 | Song | |
| 10,514,800 B2 | * | 12/2019 | Jo | G06F 3/0446 |
| 11,023,083 B2 | * | 6/2021 | Jo | G06F 3/041 |

(Continued)

FOREIGN PATENT DOCUMENTS

| KR | 1020160115726 A | 10/2016 |
|---|---|---|
| KR | 20180049325 A | 5/2018 |

(Continued)

*Primary Examiner* — Lisa Lea-Edmonds
(74) *Attorney, Agent, or Firm* — Cantor Colburn LLP

(57) ABSTRACT

A display device includes a folding area and a non-folding area, a display panel including a plurality of pixels, and a digitizer arranged at one side of the display panel and including a plurality of loop coils, where, when a hovering event of an input unit is detected in the folding area, the digitizer increases an alternating current signal applied to at least one loop coil of the plurality of loop coils arranged in the folding area, and calculates a hovering height of the input unit based on a change in a magnetic field between the input unit and loop coils of the plurality of loop coils, the loop coils including a loop coil overlapping the input unit and adjacent loop coils around the input unit.

20 Claims, 35 Drawing Sheets

(56) References Cited

U.S. PATENT DOCUMENTS

| | | | |
|---|---|---|---|
| 11,132,020 B2* | 9/2021 | Kim | G06F 1/1616 |
| 11,275,404 B2* | 3/2022 | Bae | G06F 3/04162 |
| 2010/0155153 A1 | 6/2010 | Zachut | |
| 2014/0146004 A1* | 5/2014 | Jang | G06F 1/1643 |
| | | | 345/174 |
| 2014/0313432 A1* | 10/2014 | Kasugai | G06F 1/1683 |
| | | | 349/12 |
| 2014/0313654 A1* | 10/2014 | Kasugai | G06F 3/0488 |
| | | | 361/679.4 |
| 2015/0220192 A1* | 8/2015 | Jeon | G06F 3/0412 |
| | | | 345/174 |
| 2019/0250671 A1* | 8/2019 | Park | G06F 3/0416 |
| 2019/0267430 A1 | 8/2019 | Choi et al. | |
| 2020/0089363 A1* | 3/2020 | Jo | G06F 3/041 |
| 2021/0286467 A1* | 9/2021 | Jo | G06F 3/041 |
| 2022/0011889 A1* | 1/2022 | Shin | G06F 3/046 |
| 2022/0061169 A1* | 2/2022 | Shin | G06F 1/1641 |
| 2022/0075411 A1* | 3/2022 | Lee | G06F 1/1652 |
| 2022/0075413 A1* | 3/2022 | Park | H05K 5/0226 |
| 2022/0129094 A1* | 4/2022 | Tatsuno | G06F 3/0412 |

FOREIGN PATENT DOCUMENTS

| | | |
|---|---|---|
| KR | 1020190101584 A | 9/2019 |
| KR | 102086469 B1 | 3/2020 |

\* cited by examiner

DISPLAY DEVICE

This application claims priority to Korean Patent Application No. 10-2020-0121796, filed on Sep. 21, 2020, and all the benefits accruing therefrom under 35 U.S.C. § 119, the content of which in its entirety is herein incorporated by reference.

BACKGROUND

1. Field

One or more embodiments relate to a display device, and more particularly, to a display device including a digitizer.

2. Description of the Related Art

Electronic devices providing images to users, such as smartphones, digital cameras, laptop computers, navigation devices, and smart televisions, include a display device displaying images. A display device generates an image and provides the image to users via a display screen.

Various forms of display devices have recently been developed in line with the progress in display device technology. Various flexible display devices that are deformable in a curved form or are foldable or rollable are being developed. Flexible display devices are easy to carry and may enhance user convenience.

SUMMARY

One or more embodiments include a foldable display device including a digitizer capable of detecting an accurate position of an input unit.

Additional features will be set forth in part in the description which follows and, in part, will be apparent from the description, or may be learned by practice of the presented embodiments of the invention.

According to one or more embodiments, a display device including a folding area and a non-folding area, includes a display panel including a plurality of pixels, and a digitizer arranged at one side of the display panel and including a plurality of loop coils, where, when a hovering event of an input unit is detected in the folding area, the digitizer increases an alternating current ("AC") signal applied to at least one loop coil arranged in the folding area, and calculates a hovering height of the input unit based on a change in a magnetic field between the input unit and loop coils of the plurality of loop coils, the loop coils including a loop coil overlapping the input unit and adjacent loop coils around the input unit.

In an embodiment, the plurality of loop coils may have a first width and a first thickness in the folding area and a second width and a second thickness in the non-folding area, the second width being less than the first width, and the second thickness being greater than the first thickness.

In an embodiment, the plurality of loop coils may have a linear shape.

In an embodiment, the plurality of loop coils may have a zigzag shape.

In an embodiment, the plurality of loop coils may have a linear shape in the non-folding area and a zigzag shape in the folding area.

In an embodiment, a plurality of through holes may be defined in the plurality of loop coils in the folding area.

In an embodiment, the plurality of loop coils may include a first portion corresponding to the folding area and a second portion corresponding to the non-folding area, and an end portion of the first portion may contact an end portion of the second portion.

In an embodiment, the end portion of the first portion of the plurality of loop coils may overlap above the end portion of the second portion.

In an embodiment, the end portion of the first portion of the plurality of loop coils may overlap under the end portion of the second portion.

In an embodiment, the plurality of loop coils may include a first portion corresponding to the folding area and a second portion corresponding to the non-folding area, and the first portion and the second portion may be provided as a single body.

In an embodiment, when a hovering event of the input unit is detected in the folding area, the digitizer may extend the folding area.

In an embodiment, the digitizer may increase an alternating current voltage applied to at least one loop coil of the plurality of loop coils arranged in the extended folding area.

In an embodiment, the digitizer may increase an alternating current voltage applied to at least one loop coil of the plurality of loop coils arranged within a range from a position of the input unit in the extended folding area.

According to one or more embodiments, a display device including a folding area and a non-folding area includes a digitizer including a plurality of loop coils, where the plurality of loop coils have a first width and a first thickness in the folding area and a second width and a second thickness in the non-folding area, the second width being less than the first width, and the second thickness being greater than the first thickness, where, when a hovering event of an input unit is detected in the folding area, the digitizer increases an AC signal applied to at least one loop coil of the plurality of loop coils arranged in the folding area.

In an embodiment, the plurality of loop coils may have a linear shape.

In an embodiment, the plurality of loop coils may have a zigzag shape.

In an embodiment, the plurality of loop coils may have a linear shape in the non-folding area and a zigzag shape in the folding area.

In an embodiment, a plurality of through holes may be defined in the plurality of loop coils in the folding area.

In an embodiment, when a hovering event of the input unit is detected in the folding area, the digitizer may extend the folding area, and the digitizer may increase an alternating current voltage applied to at least one loop coil of the plurality of loop coils arranged in the extended folding area.

In an embodiment, the digitizer may increase an alternating current voltage applied to at least one loop coil of the plurality of loop coils arranged within a range from a position of the input unit in the extended folding area.

BRIEF DESCRIPTION OF THE DRAWINGS

The above and other features, features, and advantages of predetermined embodiments of the invention will be more apparent from the following description taken in conjunction with the accompanying drawings, in which.

DETAILED DESCRIPTION

Figure 1A:
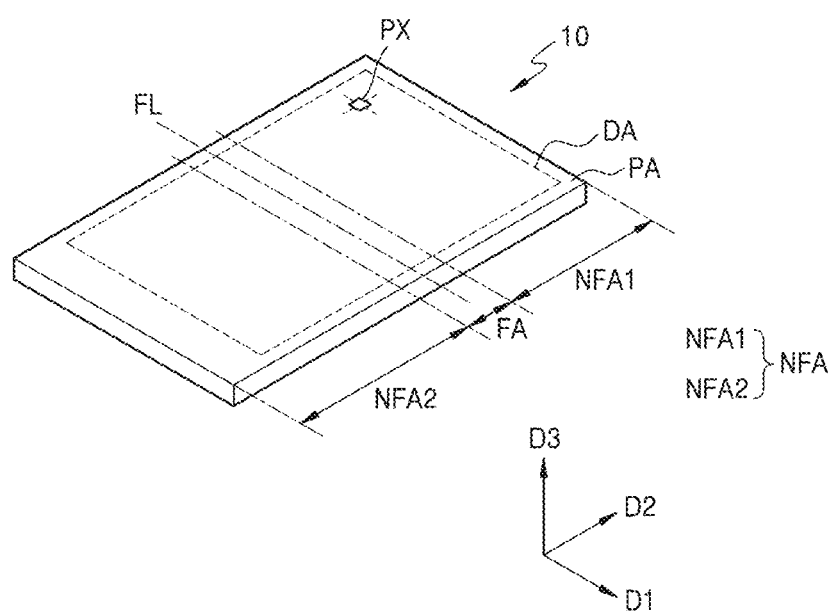
FIGS. 1A and 1B are respectively perspective views schematically illustrating an embodiment of a display device before being folded.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have various modifications and several embodiments, embodiments are shown in the drawings and will be described in detail. The effects and features of the disclosure, and ways to achieve them will become apparent by referring to embodiments that will be described later in detail with reference to the drawings. However, the disclosure is not limited to the following embodiments but may be embodied in various forms.

It will be understood that although the terms "first," "second," etc., may be used herein to describe various elements, these elements should not be limited by these terms. These terms are only used to distinguish one element from another.

In the embodiments below, the singular forms include the plural forms unless the context clearly indicates otherwise.

In the specification, it is to be understood that the terms such as "including" or "having" are intended to indicate the existence of the features or elements disclosed in the specification, and are not intended to preclude the possibility that one or more other features or elements may be added.

In the embodiments below, it will be understood when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the specification, "A and/or B" refers to A, B, or A and B. In addition, in the specification, "at least one of A and B" refers to A, B, or A and B.

In the following embodiments, the expression that a line "extending in a first direction or a second direction" includes not only a line extending in a linear form but also extending in a zigzag or curved shape in the first or second direction.

In the following embodiments, the expression "in a plan view" indicates that an object is viewed from above, and the expression "in a cross-section" indicates that a cross-sectional of the object cut vertically is viewed from a side. In the following embodiments, when a first element is described as "overlapping" a second element, it means that the first element is located above or below the second element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 1B:
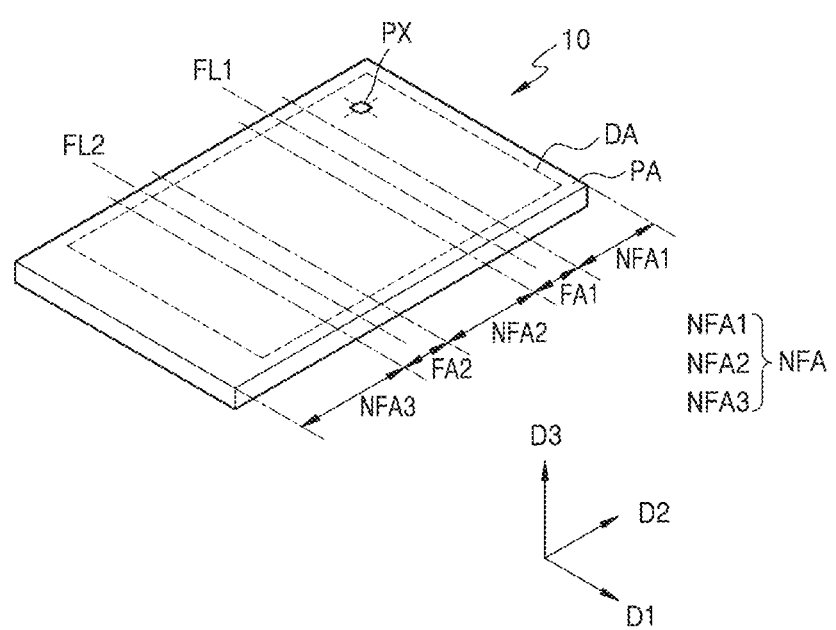

FIGS. 1A and 1B are respectively perspective views schematically illustrating an embodiment of a display device before being folded.

A display device in an embodiment may be foldable or curved. A display device may be provided in various shapes, for example, in a quadrangular (e.g., rectangular) plate shape having two pairs of sides that are parallel to each other. When a display device is provided in a rectangular plate shape, one pair of the two pairs of sides may be longer than the other pair of sides. In an embodiment, a display device having a rectangular shape with one pair of long sides and one pair of short sides is described for convenience of description. An extension direction of the short sides is indicated by a first direction D1, an extension direction of the long sides is indicated by a second direction D2, and a direction perpendicular to the extension directions of the long sides and the short sides is indicated by a third direction D3.

A shape of a display device in an embodiment is not limited to the above-described shape, but may be various ones. In an embodiment, the display device may be provided in various shapes such as a closed polygon including linear sides, a circle or an ellipse including sides including a curve, a semi-circle or semi-ellipse including sides including a straight line and a curve, or the like. In an embodiment, when a display device has a linear side, at least one of edges of each shape may be curved. In an embodiment, when a display device has a rectangular shape, a portion where adjacent linear sides meet may be replaced by a curve having a predetermined curvature. That is, a vertex portion of the rectangular shape may be a curve, two adjacent ends of which are respectively connected to two adjacent linear sides and which have a predetermined curvature. The curvature may be differently set according to positions. In an embodiment, the curvature may be varied according to a position where a curve starts and a length of the curve, or the like, for example.

Referring to FIGS. 1A and 1B, a display device 10 may include a display area DA and a peripheral area PA outside the display area DA. The display area DA is an area where a plurality of pixels PX is arranged to display an image. The peripheral area PA is a non-display area that surrounds the display area DA and where pixels are not arranged. An upper surface of the display device 10 in the third direction D3 may be defined as a display surface, and the display surface may include the display area DA and the peripheral area PA, and images may be provided to users via the display area DA.

Various electronic elements or printed circuit boards ("PCBs"), or the like may be electrically attached to the peripheral area PA, and a voltage line which supplies power to drive a display element may be disposed in the peripheral area PA. In an embodiment, a scan driver providing a scan signal to each pixel PX, a data driver providing a data signal to each pixel PX, a supply line via which a signal input to the scan driver and the data driver is input (a clock signal line, a carry signal line, a driving voltage line, or the like), and a main power line, or the like may be arranged in the peripheral area PA, for example.

At least a portion of the display device 10 may be flexible, and the flexible portion of the display device 10 may be folded. That is, the display device 10 may include a folding area FA that is flexible and foldable and a non-folding area NFA that is provided at least at a side of the folding area FA and is not folded. While an area that is not folded is referred to as a non-folding area in the embodiment, this is merely for convenience of description, and the expression "non-folding" encompasses not only a case where a portion of a display device is rigid and is not flexible, but also a case where a portion of the display device is flexible but less flexible than the folding area FA or a case where a portion of the display device is flexible but is not foldable. The display device 10 may display an image on the display area DA in the folding area FA and the non-folding area NFA.

While first and second non-folding areas NFA1 and NF2 are described to have similar areas to each other, and one folding area FA is illustrated to be between the two non-folding areas, the first and second non-folding areas NFA1 and NFA2 in FIG. 1A for convenience of description, the invention is not limited thereto. In an embodiment, the first and second non-folding areas NFA1 and NFA2 may have different areas, for example. Also, as illustrated in FIG. 1B, one or more folding areas FA may be included. In this case, a plurality of non-folding areas NFA1, NFA2, and NFA3 may be apart from one another, with folding areas FA1 and FA2 therebetween. The folding areas FA, FA1, and FA may be respectively folded with respect to folding lines FL, FL1, and FL2, and a plurality of folding lines FL, FL1, and FL2 may be provided. The folding lines FL, FL1, and FL2 are provided in the folding areas FA, FA1, and FA2 in the first direction D1, which is an extension direction of the folding areas FA, FA1, and FA2, and accordingly, the display device 10 may be folded in the folding areas FA, FA1, and FA2.

In FIGS. 1A and 1B, the folding lines FL, FL1, and FL2 pass by a center of the folding areas FA, FA1, and FA2, and the folding areas FA, FA1, and FA2 are axially symmetric with respect to the folding lines FL, FL1, and FL2, but the invention is not limited thereto. That is, the folding lines FL, FL1, and FL2 may be asymmetrically provided in the folding areas FA, FA1, and FA2. The folding areas FA, FA1, and FA2 and the folding lines FL, FL1, and FL2 of the folding areas FA, and FA1, FA2 may overlap an area of the display device 10, where an image is displayed, and when the display device 10 is folded, an image displaying portion may be folded.

In another embodiment, entire area of the display device 10 may correspond to the folding area. In an embodiment, in the case of a display device that is rollable like a scroll, entire area of the display device 10 may correspond to the folding area, for example.

The display device 10 may be flatly unfolded as a whole, as illustrated in FIGS. 1A and 1B.

In an embodiment, the display device 10 may be folded such that display surfaces thereof face each other with respect to the folding line FL. In another embodiment, the display device 10 may be folded with respect to the folding line FL such that a display surface thereof faces the outside. Here, a "display surface" refers to a surface on which an image is displayed, and a display surface includes the display area DA and the peripheral area PA. The term "folding" indicates that a shape is not fixed but is deformable from one shape to another shape, and encompasses a shape that is folded along one or more particular lines, that is, the folding line, curved, or rolled like a scroll. Thus, in an embodiment, the display device 10 may be folded such that one of first surfaces of the two non-folding areas NFA1 and NFA2 faces the other while the first surfaces are parallel to each other. In another embodiment, the display device 10 may be folded such that first surfaces of the two non-folding areas NFA1 and NFA2 are inclined at a predetermined angle (for example, an acute angle, a right angle, or an obtuse angle), with the folding area FA therebetween.

In an embodiment, the display device 10 may be, for example, a smartphone, a mobile phone, a game player, a TV, a display apparatus, a head unit for vehicles, a notebook computer, a laptop computer, a tablet computer, a personal media player ("PMP"), or a personal digital assistant ("PDA").

Figure 2:
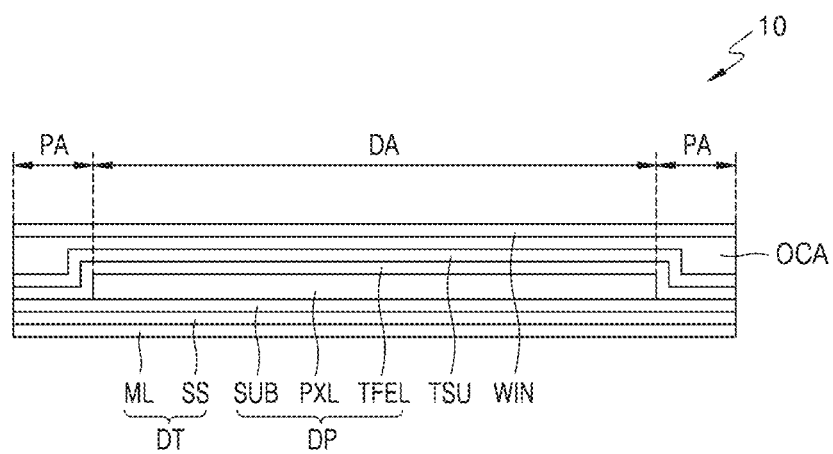
FIG. 2 is a schematic cross-sectional view of an embodiment of a display device.
Figure 3:
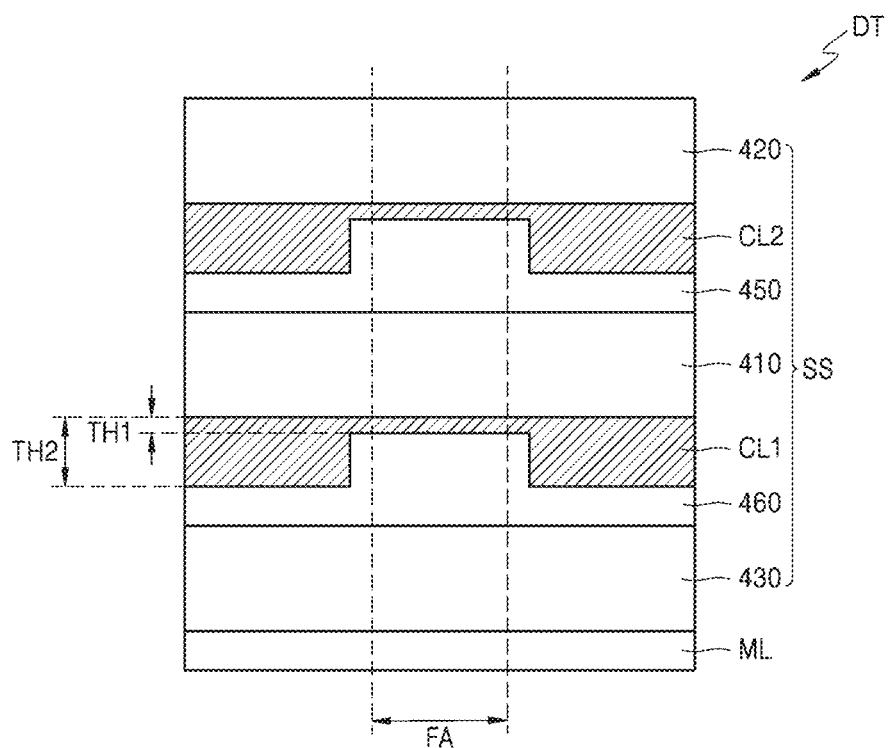
FIG. 3 is a cross-sectional view schematically illustrating a structure of a digitizer of FIG. 2.

FIG. 2 is a schematic cross-sectional view of an embodiment of a display device. FIG. 3 is a cross-sectional view schematically illustrating a structure of a digitizer of FIG. 2.

Referring to FIG. 2, the display device 10 may include a display panel DP, a touch sensing unit TSU arranged on the display panel DP, a window WIN arranged over the touch sensing unit TSU, and a digitizer DT arranged under the display panel DP.

The display panel DP may include a substrate SUB, a pixel layer PXL on the substrate SUB, and a thin-film encapsulation layer TFEL arranged above the substrate SUB to cover the pixel layer PXL. The display panel DP may be an organic light-emitting display panel. However, the invention is not limited thereto, and various image display panels that display images, such as an inorganic light-emitting display panel, a liquid crystal display panel, an electro-wetting display panel, and an electrophoretic display panel, may be used as the display panel DP.

In an embodiment, the substrate SUB may include an insulating material such as glass, quartz, a polymer resin, or the like. The substrate SUB may be a rigid substrate or a flexible substrate that is bendable, foldable, or rollable.

The pixel layer PXL may be arranged in the display area DA. In the pixel layer PXL, pixel circuits including a thin-film transistor, light-emitting elements which are display elements, and insulating layers may be arranged.

The thin-film encapsulation layer TFEL may include at least one inorganic encapsulation layer and at least one organic encapsulation layer. In an embodiment, the thin-film encapsulation layer TFEL may have a stack structure including a first inorganic encapsulation layer/an organic encapsulation layer/a second inorganic encapsulation layer.

The display device 10 may receive at least one user input via the body part of a user (e.g., finger) or an input unit (e.g., a stylus pen or an electronic pen). The display device 10 may detect a touch event from a user input.

A touch according to the invention is not limited to a contact between the display device 10 and the finger or an input unit, but may also include a non-contact (for example, when a user input device is within a distance or interval (e.g., 1 centimeter (cm)) from a surface of the display device 10 within which the user input device is detected without directly contacting the display device 10). The distance or interval in the display device 10, within which a user input device is detectable, may vary according to the performance or structure of the display device 10.

When detecting a touch event, in order to distinguish a direct touch event by a contact with a user input device from an indirect touch event (i.e., a hovering event), the display device 10 may output different detection values according to whether a touch event is a direct touch event or a hovering event (e.g., including a voltage value or a current value as analog values).

The display device 10 may include at least two touch panels to respectively detect a finger input and a pen input to thereby be able to differently detect an input by a first user input device (a body part such as the finger) (i.e., the finger input) and an input by an input unit which is a second user input device (i.e., the pen input). The at least two touch panels may provide different output values to a controller, and the controller may differently recognize input values input from the at least two touch panels to distinguish whether an input from the display device 10 is an input by the finger or an input by an input unit.

In an embodiment, the display device 10 may include the touch sensing unit TSU (first touch panel) to detect a finger input and the digitizer DT (second touch panel) to detect a pen input.

The touch sensing unit TSU may include a touch electrode and lines connected to the touch electrode. The touch sensing unit TSU may detect an external input by a self-capacitive method or a mutual capacitive method.

The touch sensing unit TSU may be disposed on the thin-film encapsulation layer TFEL. In an alternative embodiment, the touch sensing unit TSU may be separately disposed on a touch substrate and then coupled onto the thin-film encapsulation layer TFEL by an adhesive layer such as an optical clear adhesive ("OCA"). In an embodiment, the touch sensing unit TSU may be disposed directly on the thin-film encapsulation layer TFEL, and in this case, no adhesive layer may be between the touch sensing unit TSU and the thin-film encapsulation layer TFEL.

The digitizer DT is a type of touch panel that detects a pen input to receive position information indicated by a user on a display surface. The digitizer DT may convert an analog signal received by detecting hovering or pen pressure of an input unit, into a digital signal, to allow a visual image to be input, stored, output, or manipulated. The digitizer DT may be implemented using an electromagnetic method or an electromagnetic resonance method. In an embodiment, the digitizer DT may include a sensor substrate including a plurality of coils, for example. The digitizer DT may determine a position of a pen by detecting an electromagnetic change caused by an approach by the pen. The digitizer DT is not necessarily to be arranged on a front surface of the display panel DP, but may also be arranged under a rear surface of the display panel DP.

Referring to FIG. 3 together, the digitizer DT may include a sensor substrate SS and a magnetic layer ML arranged over a rear surface of the sensor substrate SS. A plurality of loop coils is arranged on the sensor substrate SS.

The sensor substrate SS may include a first circuit layer CL1, a second circuit layer CL2, and a cover layer 430. The first circuit layer CL1 may include a first conductive layer disposed on a surface of the first base layer 410. The second circuit layer CL2 may include a second conductive layer disposed on a surface of the second base layer 420. A thickness TH1 of the first and second conductive layers of the first circuit layer CL1 and the second circuit layer CL2 may be less in the folding area FA than a thickness TH2 thereof in other areas except for the folding area FA.

In an embodiment, the first base layer 410 and the second base layer 420 may be insulating layers and may include, for example, polyimide ("PI").

In an embodiment, the first and second conductive layers of the first circuit layer CL1 and the second circuit layer CL2 may include a plurality of loop coils, and the plurality of loop coils may include a metal material such as copper (Cu), aluminum (Al), molybdenum (Mo), silver (Ag), or the like. A width and thickness of a loop coil arranged in the folding area FA may be different from those of a loop coil arranged in the non-folding area NFA other than the folding area FA. In an embodiment, a width of a loop coil arranged in the folding area FA may be greater than that of a loop coil arranged in the non-folding area NFA, and a thickness of a loop coil arranged in the folding area FA may be less than that of a loop coil arranged in the non-folding area NFA.

The digitizer DT using an electromagnetic resonance ("EMR") method desires a high current to detect a hovering event and thus needs a low-resistance line. Also, when a thickness of lines of the folding area FA is relatively thick, line cracks may be generated during folding, thus increasing resistance and degrading event detecting performance in turn.

In an embodiment, the arrangement of lines (loop coils) in the folding area FA may be minimized, and also, a loop coil having a less thickness than that of a loop coil arranged in the non-folding area NFA may be arranged in the folding area FA to prevent cracks. Also, to reduce an increase in resistance due to a reduced thickness of a loop coil, a width of a loop coil arranged in the folding area FA may be set to be greater than a width of a loop coil arranged in the non-folding area NFA.

In an embodiment, the first circuit layer CL1 and the second circuit layer CL2 may be adhered to each other using a first adhesive layer 450 such as a pressure sensitive adhesive ("PSA"), a thermosetting adhesive, or the like. The first adhesive layer 450 may be between the first base layer 410 and the second circuit layer CL2.

In an embodiment, the cover layer 430 may include PI and may be adhered to the first circuit layer CL1 using a second adhesive layer 460 such as a PSA, a thermosetting adhesive, or the like. The second adhesive layer 460 may be between the cover layer 430 and the first circuit layer CL1.

When a magnitude of a magnetic field applied to the digitizer DT decreases, a maximum distance within which the digitizer DT recognizes an input unit is shortened, thus increasing the possibility of malfunction of the digitizer DT. The magnetic layer ML may reduce a decrease in the magnitude of a magnetic field by preventing destructive interference due to a conductive element disposed around the digitizer DT.

The magnetic layer ML may include a magnetic material to induce an electromagnetic field of the sensor substrate SS. The magnetic layer ML may include an amorphous metal having high magnetic properties. The magnetic layer ML may have a structure in which metal magnetic powder in the form of thin plate-shaped pieces (referred to as flakes) is irregularly (or randomly) distributed in an insulating and/or adhesive resin base material. That is, the magnetic layer ML may include non-oriented magnetic powder. In an embodiment, a thermal compression bonding process may be performed on the magnetic layer ML, and accordingly, the magnetic powder may be aligned in a predetermined direction (that is, oriented) to improve the characteristics of the magnetic layer ML before it is oriented.

The magnetic layer ML may be provided by deforming magnetic powders such as ferrite, molypermalloy powder ("MPP"), Fe—Si—Al alloy powder (Sendust), or Ni—Fe alloy powder (Highflux) into flakes, adding the deformed magnetic powder to an insulating and/or adhesive resin (or adhesive) and distributing the magnetic powders therein, and coating the resin in which the magnetic powders are distributed, on a surface of the cover layer 430.

The window WIN may be arranged above the display panel DP to protect the display panel DP. The window WIN may be adhered to the touch sensing unit TSU using an OCA.

Although not illustrated in the drawings, an optical functional layer may be further included between the touch sensing unit TSU and the window WIN. The optical functional layer may include an anti-reflection layer. The anti-reflection layer may reduce a reflectance of light (external light) incident from the outside to the display panel DP. In some embodiments, the optical functional layer may be a polarization film. In another embodiment, the optical functional layer may include a filter plate including a black matrix and color filters.

Figure 4:
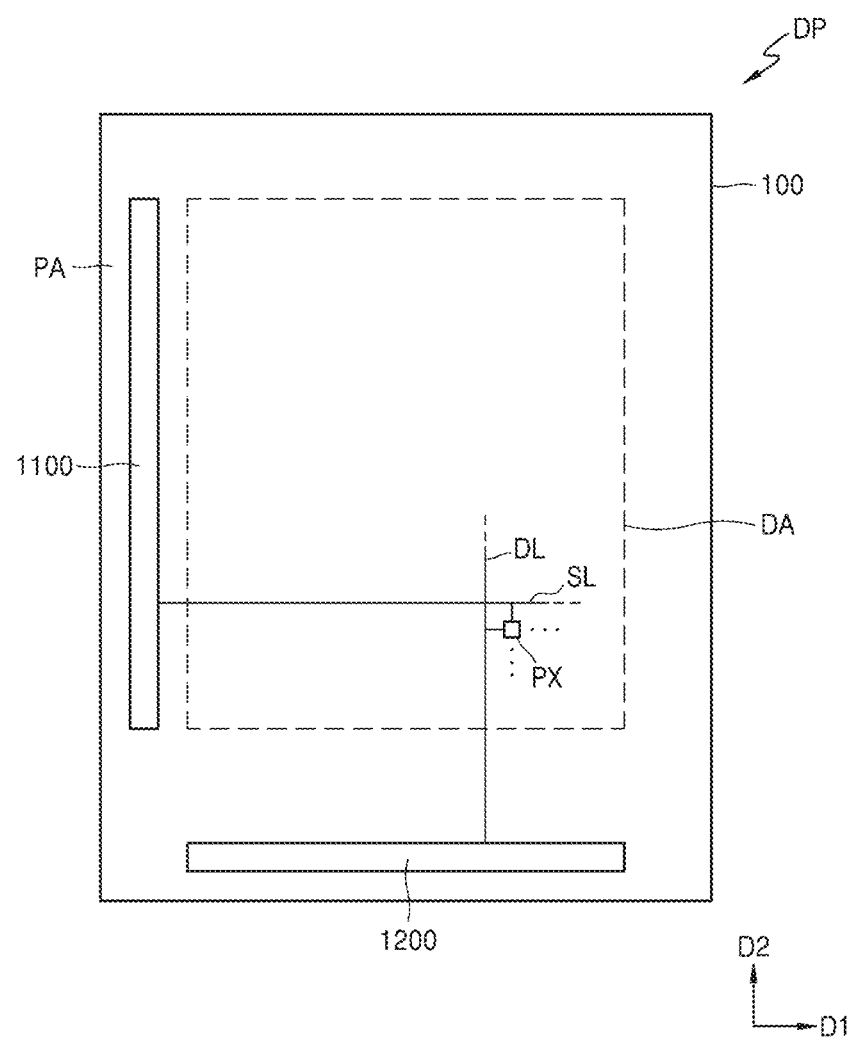
FIG. 4 is a cross-sectional view schematically illustrating an embodiment of a display panel.

FIG. 4 is a cross-sectional view schematically illustrating an embodiment of a display panel.

Referring to FIG. 4, a display panel DP may include a display area DA and a peripheral area PA. FIG. 4 illustrates a substrate 100 of the display panel DP, and the substrate 100 may include the display area DA and the peripheral area PA.

The display panel DP may include a plurality of pixels PX arranged in the display area DA.

A scan driver 1100 providing a scan signal to a pixel circuit connected to the pixel PX, a data driver 1200 providing a data signal to the pixel circuit connected to the pixel PX, and main power lines (not shown) for providing a driving voltage and a common voltage to the pixel circuit, or the like may be arranged in the peripheral area PA.

While the data driver 1200 is arranged adjacent to one side of the substrate 100 in FIG. 4, according to another embodiment, the data driver 1200 may be arranged on a flexible PCB ("FPCB") electrically connected to one side of the display panel DP.

Figure 5A:
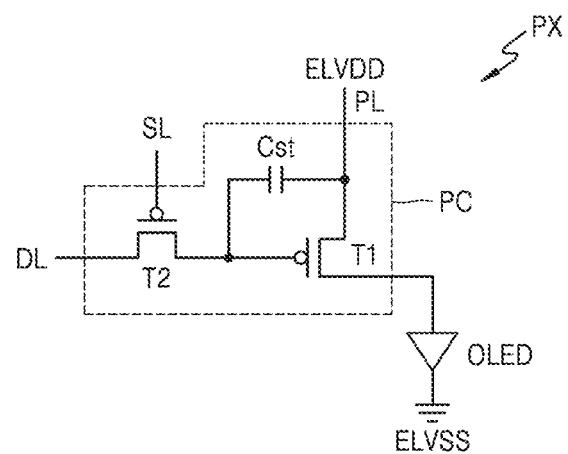
FIGS. 5A and 5B are equivalent circuit diagrams schematically illustrating an embodiment of any pixel of a display panel.
Figure 5B:
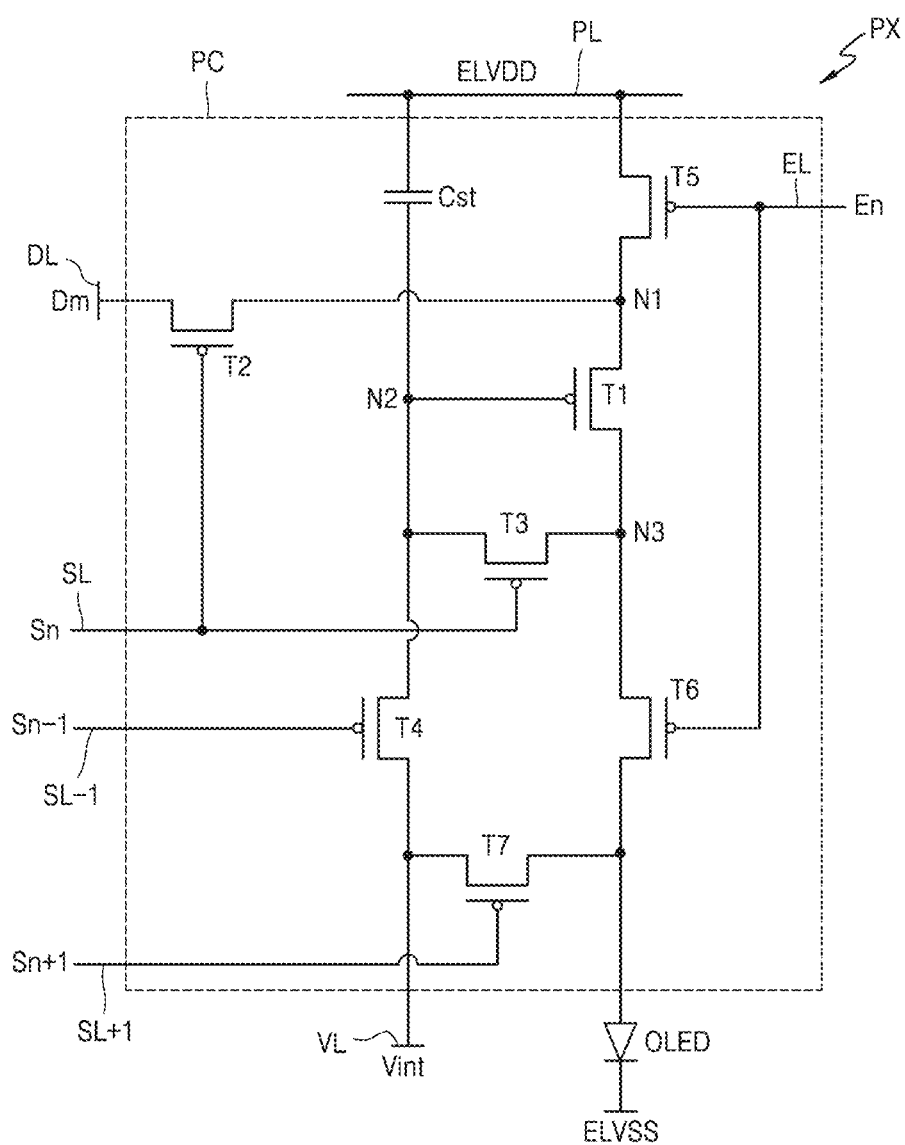

FIGS. 5A and 5B are equivalent circuit diagrams schematically illustrating an embodiment of any pixel of a display panel.

As illustrated in FIG. 5A, a pixel PX, which is a display element, may include an organic light-emitting diode OLED, and the organic light-emitting diode OLED may be connected to a pixel circuit PC. The pixel circuit PC may include a first transistor T1, a second transistor T2, and a capacitor Cst. In an embodiment, the pixel PX may emit light of, for example, red, green, blue, or white from the organic light-emitting diode OLED.

The second transistor T2 may be a switching transistor and be connected to a scan line SL and a data line DL, and may transfer a data voltage received from the data line DL to the first transistor T1, based on a switching voltage received from the scan line SL. The capacitor Cst may be connected to the second transistor T2 and a driving voltage line PL and may store a voltage corresponding to a difference between a voltage received from the second transistor T2 and a driving voltage ELVDD supplied to the driving voltage line PL.

The first transistor T1 may be a driving transistor and be connected to the driving voltage line PL and the capacitor Cst, and may control a driving current flowing from the driving voltage line PL to the organic light-emitting diode OLED, in accordance with a voltage value stored in the capacitor Cst. The organic light-emitting diode OLED may emit light of a predetermined brightness, according to a driving current. An opposite electrode (e.g., a cathode) of the organic light-emitting diode OLED may receive a common voltage ELVSS.

While it is described with respect to FIG. 5A that the pixel circuit PC includes two transistors and one capacitor, the invention is not limited thereto. A number of transistors and a number of capacitors may be variously modified according to the design of the pixel circuit PC.

As illustrated in FIG. 5B, the pixel circuit PC may include first through seventh transistors T1 through T7 and a capacitor Cst. A first terminal of each of the first through seventh transistors T1 through T7 may be a source terminal or a drain terminal, and a second terminal thereof may be a different terminal from the first terminal according to a transistor type (p-type or n-type) and/or operating conditions of a transistor. In an embodiment, when a first terminal is a source terminal, a second terminal may be a drain terminal, for example.

The pixel circuit PC may be connected to a first scan line SL via which a first scan signal Sn (n is a natural number) is transmitted, a second scan line SL-1 via which a second scan signal Sn-1 is transmitted, a third scan line SL+1 via which a third scan signal Sn+1 is transmitted, an emission control line EL via which an emission control signal En is transmitted, and the data line DL via which a data signal Dm (m is a natural number) is transmitted, the driving voltage line PL via which the driving voltage ELVDD is transmitted, and an initialization voltage line VL via which an initialization voltage Vint is transmitted.

The first transistor T1 includes a gate terminal connected to a second node N2, a first terminal connected to a first node N1, and a second terminal connected to a third node N3. The first transistor T1 acts as a driving transistor, and supplies a driving current to a light-emitting element by receiving the data signal Dm according to a switching operation of the second transistor T2. The light-emitting element may be the organic light-emitting diode OLED.

The second transistor T2 (switching transistor) includes a gate terminal connected to the first scan line SL, a first terminal connected to the data line DL, and a second terminal connected to the first node N1 (or the first terminal of the first transistor T1). The second transistor T2 may be turned on according to the first scan signal Sn received via the first scan line SL to perform a switching operation of transmitting the data signal Dm transmitted to the data line DL, to the first node N1.

The third transistor T3 (compensation transistor) includes a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on according to the first scan signal Sn received via the first scan line SL to diode-connect the first transistor T1, thereby compensating for a threshold voltage of the first transistor T1. The third transistor T3 may have a structure in which two or more transistors are serially connected.

The fourth transistor T4 (first initialization transistor) includes a gate terminal connected to the second scan line SL-1, a first terminal connected to the initialization voltage line VL, and a second terminal connected to the second node N2. The fourth transistor T4 may be turned on according to the second scan signal Sn-1 received via the second scan line SL-1 to transmit the initialization voltage Vint to the gate terminal of the first transistor T1, thereby initializing a gate voltage of the first transistor T1. The fourth transistor T4 may have a structure in which two or more transistors are serially connected.

The fifth transistor T5 (first emission control transistor) includes a gate terminal connected to the emission control line EL, a first terminal connected to the driving voltage line PL, and a second terminal connected to the first node N1. The sixth transistor T6 (second emission control transistor) includes a gate terminal connected to the emission control line EL, a first terminal connected to the third node N3, and a second terminal connected to a pixel electrode of the organic light-emitting diode OLED. As the fifth transistor T5 and the sixth transistor T6 are simultaneously turned on according to the emission control signal En received through the emission control line EL, a current flows in the organic light-emitting diode OLED.

The seventh transistor T7 (second initialization transistor) includes a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on according to the third scan signal Sn+1 received via the third scan line SL+1 to transmit the initialization voltage Vint to the pixel electrode of the organic light-emitting diode OLED, thereby initializing a voltage of the pixel electrode of the organic light-emitting diode OLED. In another embodiment, the seventh transistor T7 may be omitted.

The capacitor Cst includes a first electrode connected to the second node N2 and a second electrode to the driving voltage line PL. The capacitor Cst may be connected to the driving voltage line PL and the gate terminal of the first transistor T1 to store and maintain a voltage corresponding to a difference between voltages at the two ends, thereby maintaining a voltage applied to the gate terminal of the first transistor T1.

The organic light-emitting diode OLED may include the pixel electrode and a common electrode facing the pixel electrode, and the common electrode may receive the common voltage ELVSS. The organic light-emitting diode OLED may receive a driving current from the first transistor T1 to emit light of a predetermined color, thereby displaying an image. The common electrode may be included commonly, that is, as a single body, with respect to a plurality of pixels.

In FIG. 5B, while the fourth transistor T4 and the seventh transistor T7 are respectively connected to the second scan line SL-1 and the third scan line SL+1, the invention is not limited thereto. In another embodiment, both the fourth transistor T4 and the seventh transistor T7 may be connected to the second scan line SL-1 to be driven according to the second scan signal Sn-1.

Figure 6:
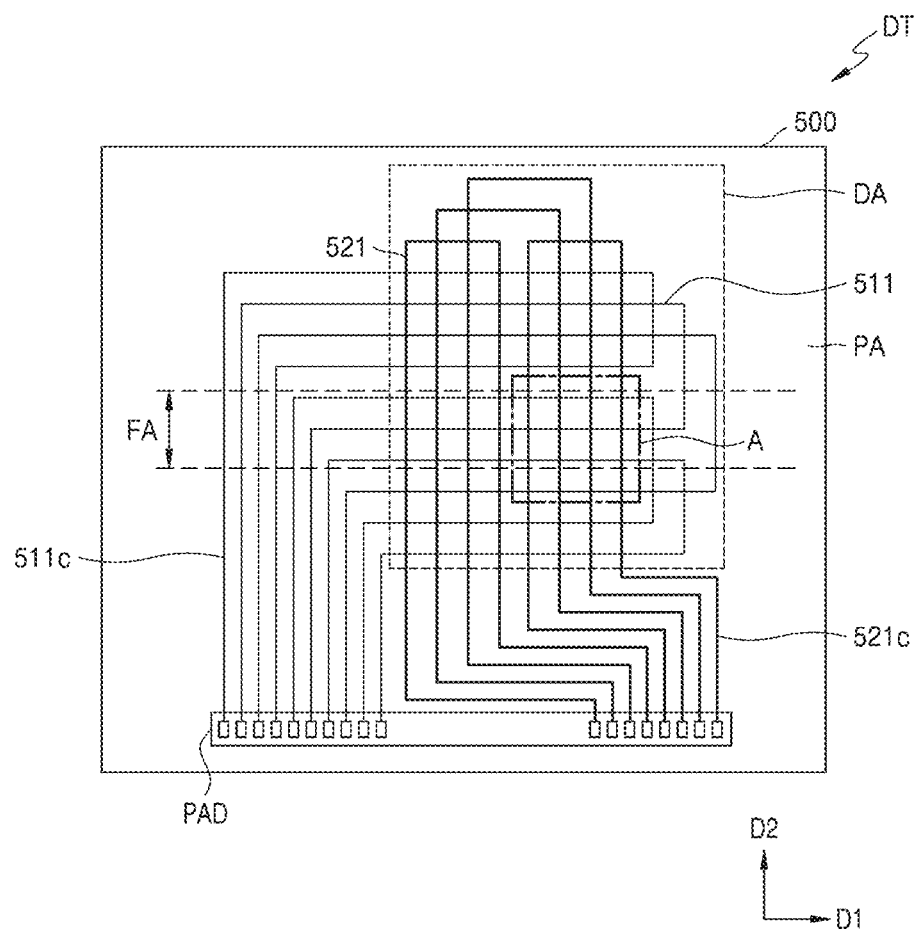
FIG. 6 is a schematic diagram of an embodiment of a digitizer.
Figure 7:
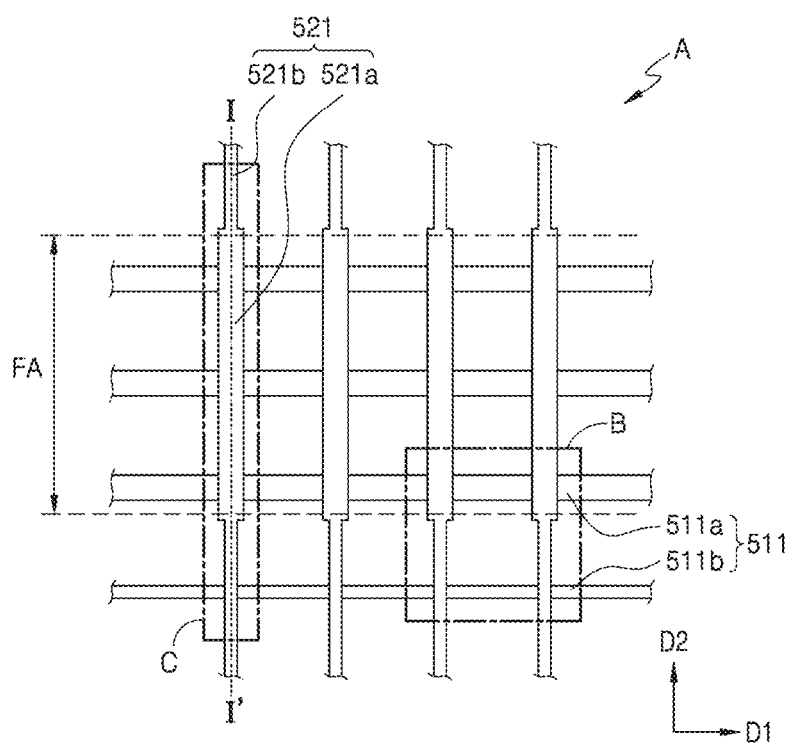
FIG. 7 is an enlarged view of portion A of the digitizer illustrated in FIG. 6.
Figure 8A:
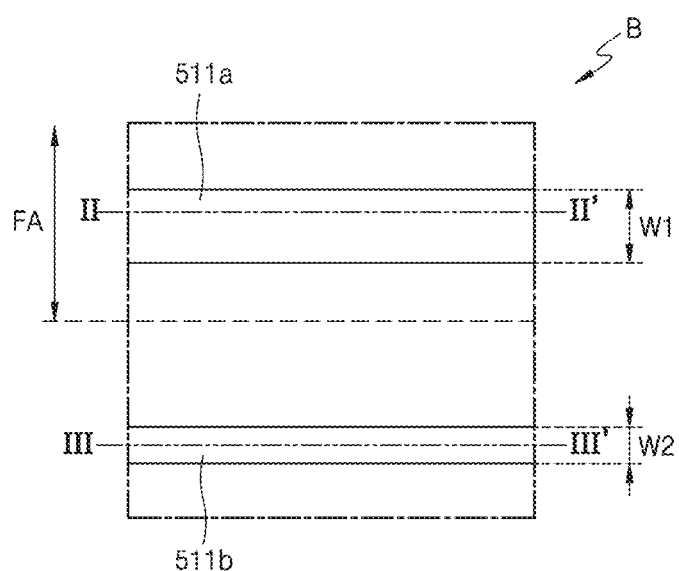
FIGS. 8A and 8B are enlarged views of portion B of a loop coil illustrated in FIG. 7.
Figure 8B:
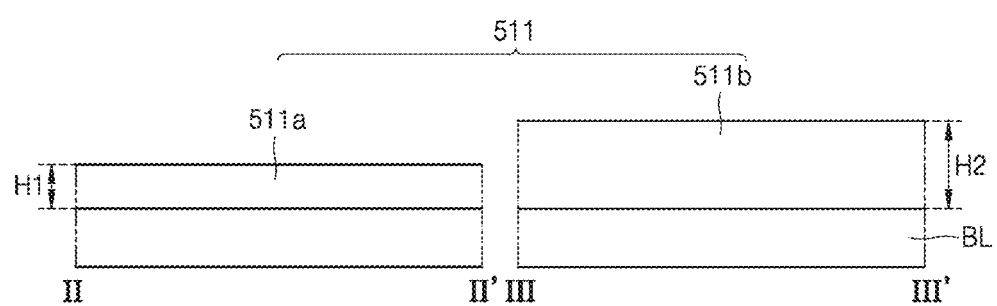
Figure 9A:
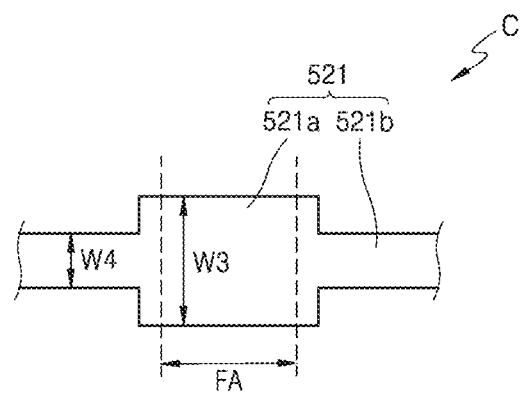
FIGS. 9A and 9B are enlarged views of portion C of the loop coil illustrated in FIG. 7.
Figure 9B:
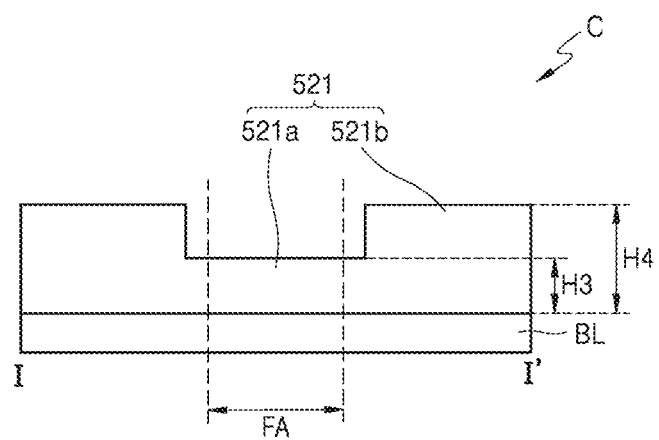
Figure 10:
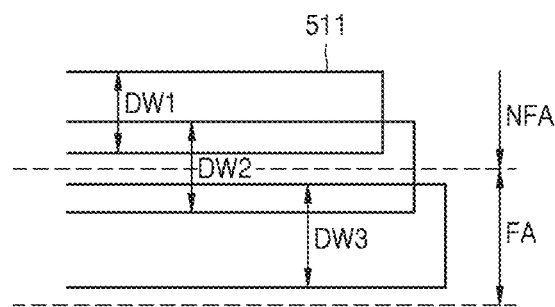
FIG. 10 is a diagram for describing a distance between lines of a first loop coil.

FIG. 6 is a schematic diagram of an embodiment of a digitizer. FIG. 7 is an enlarged view of portion A of the digitizer illustrated in FIG. 6. FIGS. 8A and 8B are enlarged views of portion B of a loop coil illustrated in FIG. 7. FIGS. 9A and 9B are enlarged views of portion C of the loop coil illustrated in FIG. 7. FIGS. 8A and 9A are plan views, and FIGS. 8B and 9B are cross-sectional views. FIG. 10 is a diagram for describing a distance between lines of a first loop coil.

Referring to FIG. 6, the digitizer DT may include a sensor substrate 500. The sensor substrate 500 may be an FPCB.

A plurality of loop coils may be arranged in the display area DA of the sensor substrate 500. Some of the plurality of loop coils may be arranged in the non-folding area NFA. Some other ones of the plurality of loop coils may be arranged in the folding area FA. Some still other ones of the plurality of loop coils may include a portion arranged in the folding area FA and a portion arranged in the non-folding area NFA.

A first loop group including a plurality of first loop coils 511 that are in a quadrangular (e.g., rectangular) shape and arranged in parallel in a second direction D2 and a second loop group including a plurality of second loop coils 521 that are in a quadrangular (e.g., rectangular) shape and arranged in parallel in a first direction D1 may be included in the sensor substrate 500. The first loop coil 511 and the second loop coil 521 may be orthogonal to each other, and the first loop coil 511 and the second loop coil 521 may overlap each other in intersections. The first loop coil 511 extends relatively longer in the first direction D1 than in the second direction D2, and the second loop coil 521 extends relatively longer in the second direction D2 than in the first direction D1. Ends of the first loop coil 511 and the second loop coil 521 may be connected to their respective pads of a pad unit PAD. A connection line 511c between the first loop coil 511 and a pad may extend from the first loop coil 511 to be arranged in the peripheral area PA, and a connection line 521c between the second loop coil 521 and a pad may extend from the second loop coil 521 to be arranged in the peripheral area PA. The connection lines 511c and 521c may be respectively disposed in a same layer as the first loop coil 511 and the second loop coil 521 as a single body therewith, or may be respectively arranged in different layers from the first loop coil 511 and the second loop coil 521 and respectively electrically connected to the first loop coil 511 and the second loop coil 521.

The first loop coils 511 may intersect (overlap) each other. In an embodiment, one of two first loop coils 511 that intersect each other may be divided into portions in an intersection area, and the portions may be connected by a bridge electrode in another layer through a via hole in an upper or lower insulating layer, for example. Likewise, the second loop coils 521 may intersect (overlap) each other. In an embodiment, one of two second loop coils 521 that intersect each other may be divided into portions in an intersection area, and the portions may be connected by a bridge electrode in another layer through a via hole in an upper or lower insulating layer, for example.

The first loop coil 511 and the second loop coil 521 may each have a single-layer structure or a multi-layer structure including layers stacked in a third direction D3. In an embodiment, the first loop coil 511 and the second loop coil 521 may include a metal material such as copper (Cu), aluminum (Al), molybdenum (Mo), silver (Ag), or the like.

In an embodiment, the first circuit layer CL1 illustrated in FIG. 3 may include the first loop coil 511 and the second circuit layer CL2 illustrated in FIG. 3 may include the second loop coil 521. In another embodiment, the first circuit layer CL1 may include the second loop coil 521, and the second circuit layer CL2 may include the first loop coil 511. FIG. 7 illustrates an embodiment in which the first circuit layer CL1 includes the first loop coil 511 and the second circuit layer CL2 includes the second loop coil 521.

Referring to FIG. 7, some of a plurality of first loop coils 511 may be arranged in the non-folding area NFA. Some other ones of the plurality of first loop coils 511 may be arranged in the folding area FA. Some still other ones of the plurality of first loop coils 511 may include a portion arranged in the folding area FA and a portion arranged in the non-folding area NFA. A plurality of second loop coils 521 may include a portion arranged in the folding area FA and a portion arranged in the non-folding area NFA.

Hereinafter, the portion of the first loop coils 511 arranged in the folding area FA will be referred to as a first portion 511a, and the portion of the first loop coils 511 arranged in the non-folding area NFA will be referred to as a second portion 511b. Depending on their arrangement position, the first loop coils 511 may include loop coils including only the first portion 511a, loop coils including only the second portion 511b, and loop coils including the first portion 511a and the second portion 511b.

Similarly, the portion of the second loop coils 521 arranged in the folding area FA will be referred to as a first portion 521a, and the portion of the second loop coils 521 arranged in the non-folding area NFA will be referred to as a second portion 521b. The second loop coils 521 may include the first portion 521a and the second portion 521b.

Referring to FIG. 8A, a width W1 of the first portion 511a of the first loop coil 511 is greater than a width W2 of the second portion 511b of the first loop coil 511. Referring to FIG. 8B, a thickness H1 of the first portion 511a of the first loop coil 511 is less than a thickness H2 of the second portion 511b of the first loop coil 511.

Referring to FIG. 9A, a width W3 of the first portion 521a of the second loop coil 521 is greater than a width W4 of the second portion 521b of the second loop coil 521. Referring to FIG. 9B, a thickness H3 of the first portion 521a of the second loop coil 521 is less than a thickness H4 of the second portion 521b of the second loop coil 521.

In an embodiment, the first portions 511a and 521a of the first loop coil 511 and the second loop coil 521 may have a thickness of about 0.2 micrometer (μm) to about 1 μm and a width of about 400 μm to about 800 μm. The second portions 511b and 521b of the first loop coil 511 and the second loop coil 521 may have a thickness of about 6 μm or greater and a width of about 200 μm to about 400 μm.

In FIGS. 6 and 7, a distance between parallel lines of the first loop coil 511 and the second loop coil 521, the lines facing each other, is constant. In another embodiment, as illustrated in FIG. 10, distances between parallel lines that face each other may vary according to a position of the first loop coil 511. As being closer to the folding area FA, the distance between parallel lines of the first loop coil 511, the parallel lines facing each other, may increase. In an embodiment, a distance DW3 between facing lines of a first loop coil arranged in the folding area FA may be greater than a distance DW1 between facing lines of a first loop coil arranged in the non-folding area NFA, for example. A distance DW2 between facing lines of a first loop coil, with one of the facing lines arranged in the non-folding area NFA and the other arranged in the folding area FA, may be greater than the distance DW1 and less than the distance DW3.

FIGS. 11A through 11D are diagrams for describing an embodiment of a method of manufacturing a loop coil. FIGS. 11A through 11D may be a method of manufacturing the first loop coil 511 or the second loop coil 521.

Figure 11A:
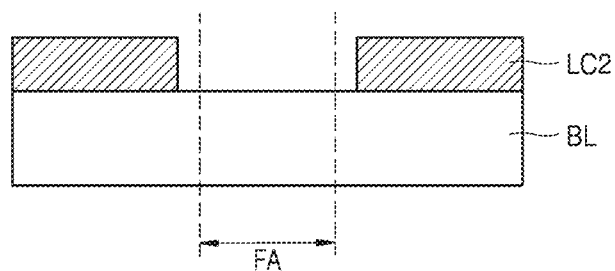
FIGS. 11A through 11D are diagrams for describing an embodiment of a method of manufacturing a loop coil.

Referring to FIG. 11A, a second portion LC2 of a loop coil having a second thickness and a second width may be disposed in the non-folding area NFA of the base layer BL. In an embodiment, by forming a conductive layer on a surface of the sensor substrate 500 and then removing a portion of the conductive layer in the folding area FA, a conductive pattern constituting the second portion 511b of the first loop coil 511 or the second portion 521b of the second loop coil 521 may be disposed in the non-folding area NFA, for example.

The second portion LC2 of the loop coil may be provided using a pressing process or an electrolysis process. In an embodiment, the second portion LC2 of the loop coil may be provided by applying a slurry provided by mixing or dispersing an active material, a binder, and a conductive material in a solvent, on an FPCB and then drying the slurry, performing a pressing processing on the FPCB, forming an electrode coating layer on the FPCB, and removing a portion of the electrode coating layer corresponding to the folding area FA, for example.

Figure 11B:
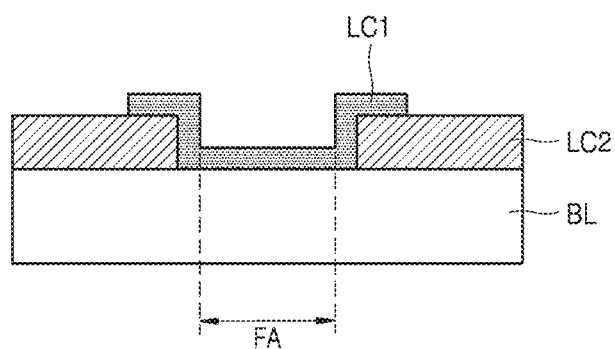

Next, referring to FIG. 11B, a first portion LC1 of the loop coil having a first thickness and a first width may be disposed in the folding area FA of the base layer BL. In an embodiment, a conductive pattern constituting the first portion 511a of the first loop coil 511 or the first portion 521a of the second loop coil 521 may be disposed in the folding area FA of the sensor substrate 500, for example. The first portion LC1 of the loop coil may be provided using a deposition process such as sputtering. An end portion of the first portion LC1 of the loop coil may overlap and contact an end portion of the second portion LC2 in the non-folding area NFA in the vicinity of a boundary between the folding area FA and the non-folding area NFA. The first thickness may be less than the second thickness, and the first width may be greater than the second width. A metal material of the first portion LC1 of the loop coil may be identical to or different from a metal material of the second portion LC2 of the loop coil.

Figure 11C:
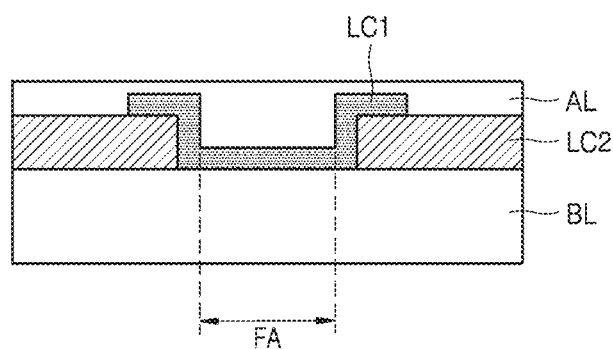

Next, referring to FIG. 11C, an adhesive layer AL covering the loop coil of the base layer BL may be formed.

Figure 11D:
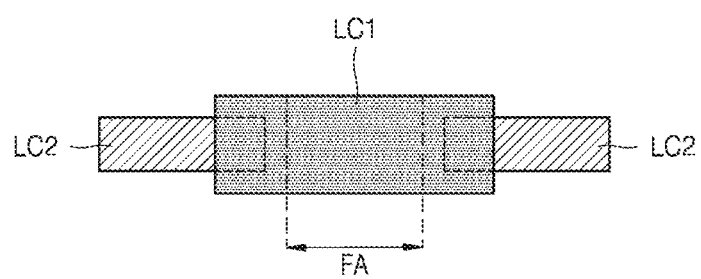

As illustrated in FIG. 11D, the first portion LC1 of the loop coil may be a bridge electrode that connects portions of the second portion LC2 that are arranged in the non-folding area NFA and are apart from the folding area FA and face each other.

FIGS. 12A through 12D are diagrams for describing an embodiment of a method of manufacturing a loop coil. FIGS. 12A through 12D may be a method of manufacturing the first loop coil 511 or the second loop coil 521.

Figure 12A:
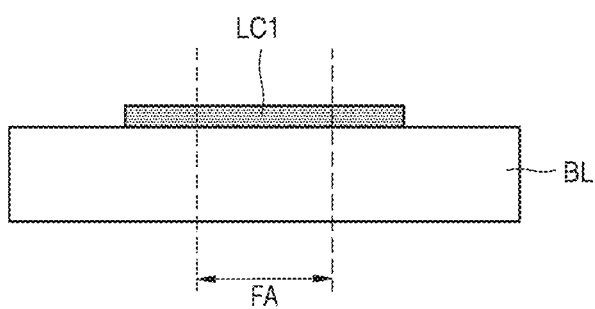
FIGS. 12A through 12D are diagrams for describing an embodiment of a method of manufacturing a loop coil.

Referring to FIG. 12A, a first portion LC1 of the loop coil having a first thickness and a first width may be disposed in the folding area FA of the base layer BL. In an embodiment, a conductive pattern constituting the first portion 511a of the first loop coil 511 or the first portion 521a of the second loop coil 521 may be disposed in the folding area FA of the sensor substrate 500, for example. The first portion LC1 of the loop coil may be provided using a deposition process such as sputtering.

Figure 12B:
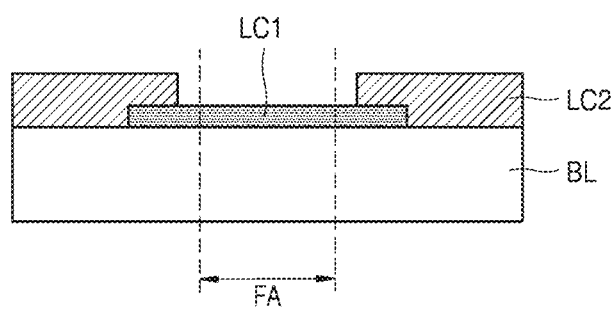

Next, referring to FIG. 12B, a second portion LC2 of the loop coil having a second thickness and a second width may be disposed in the non-folding area NFA of the base layer BL. In an embodiment, a conductive pattern constituting the second portion 511b of the first loop coil 511 or the second portion 521b of the second loop coil 521 may be disposed in the non-folding area NFA of the sensor substrate 500, for example. The second portion LC2 of the loop coil may be provided using a pressing process or an electrolysis process. An end portion of the second portion LC2 of the loop coil may overlap and contact an end portion of the first portion LC1 in the non-folding area NFA in the vicinity of a boundary between the folding area FA and the non-folding area NFA. A metal material of the second portion LC2 of the loop coil may be identical to or different from a metal material of the first portion LC1 of the loop coil.

Figure 12C:
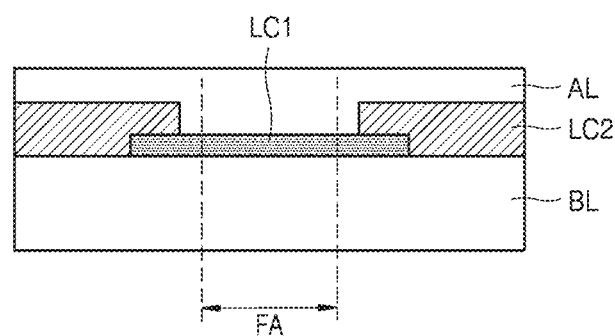

Next, referring to FIG. 12C, an adhesive layer AL covering the loop coil of the base layer BL may be provided.

Figure 12D:
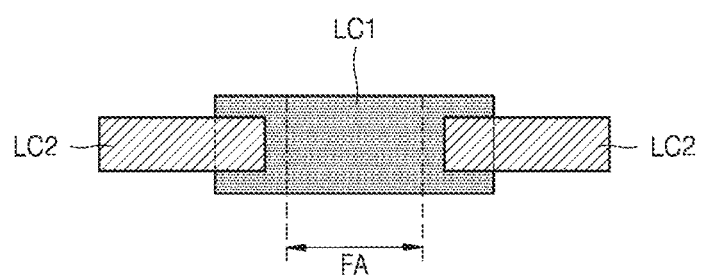

As illustrated in FIG. 12D, the first portion LC1 of the loop coil may be a bridge electrode that connects portions of the second portion LC2 that are arranged in the non-folding area NFA and are apart from the folding area FA and face each other.

FIGS. 13A through 13D are diagrams for describing an embodiment of a method of manufacturing a loop coil. FIGS. 13A through 13D may be a method of manufacturing the first loop coil 511 or the second loop coil 521.

Figure 13A:
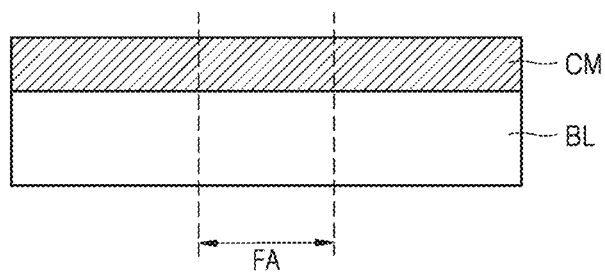
FIGS. 13A through 13D are diagrams for describing an embodiment of a method of manufacturing a loop coil.
Figure 13B:
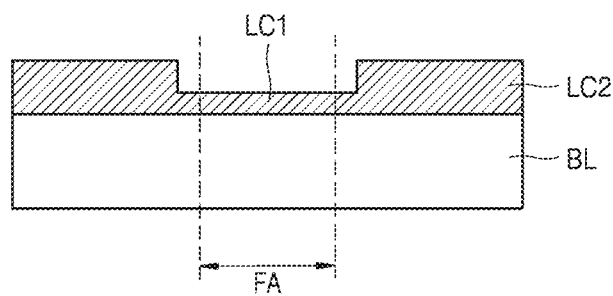
Figure 13C:
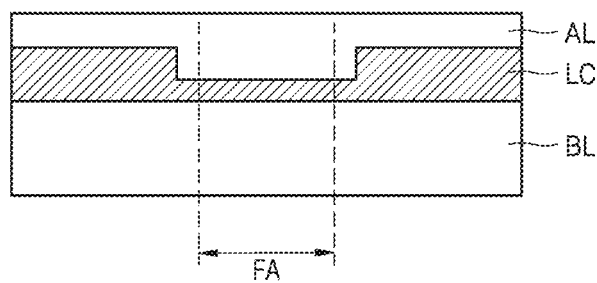

By forming a conductive layer CM on the base layer BL as illustrated in FIG. 13A and etching a portion of the conductive layer CM corresponding to the folding area FA by a mask process (e.g., a halftone mask process) as illustrated in FIG. 13B, a first portion LC1 of a loop coil LC having a first thickness and a first width and a second portion LC2 of the loop coil LC having a second thickness and a second width may be provided. Next, as illustrated in FIG. 13C, an adhesive layer AL covering the loop coil LC of the base layer BL may be provided.

Figure 13D:
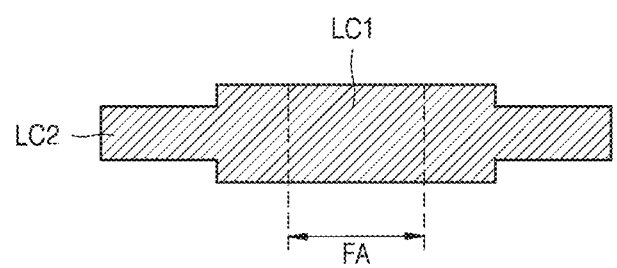

As illustrated in FIG. 13D, the first portion LC1 and the second portion LC2 of the loop coil LC may be a conductive pattern provided as a single body.

FIGS. 14A through 14E are diagrams illustrating an embodiment of a loop coil.

As described above, in an embodiment, a loop coil LC may have a linear shape. A first portion LC1 and a second portion LC2 of the loop coil LC may have a linear shape. A thickness of the first portion LC1 of the loop coil LC may be less than a thickness of the second portion LC2 thereof, and a width of the first portion LC1 may be greater than a width of the second portion LC2.

In an embodiment, the loop coil LC may have a winding structure provided by a zigzag shape having a single turn or multiple turns to have higher magnetic sensitivity. The first portion LC1 and the second portion LC2 of the loop coil LC may have a zigzag shape. A thickness of the first portion LC1 of the loop coil LC may be less than a thickness of the second portion LC2 thereof, and a width of the first portion LC1 may be greater than a width of the second portion LC2.

Figure 14A:
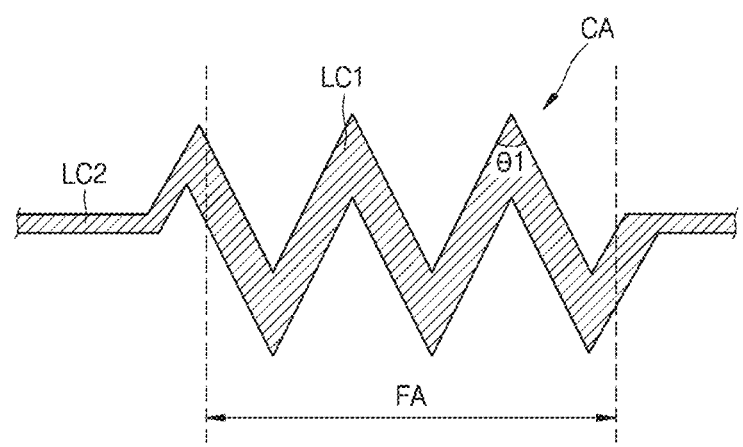
FIGS. 14A through 14E are diagrams illustrating an embodiment of a loop coil.
Figure 14B:
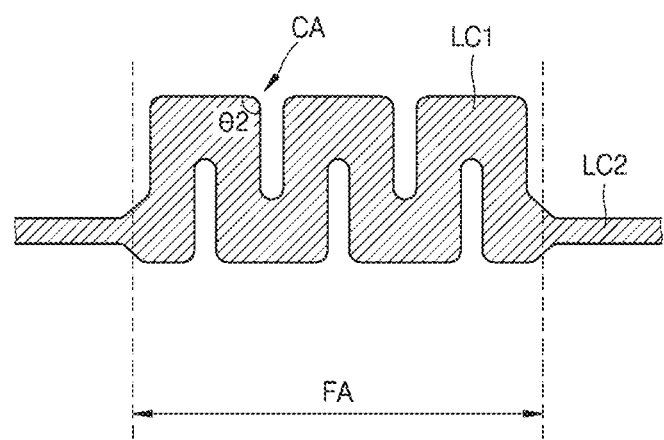
Figure 14C:
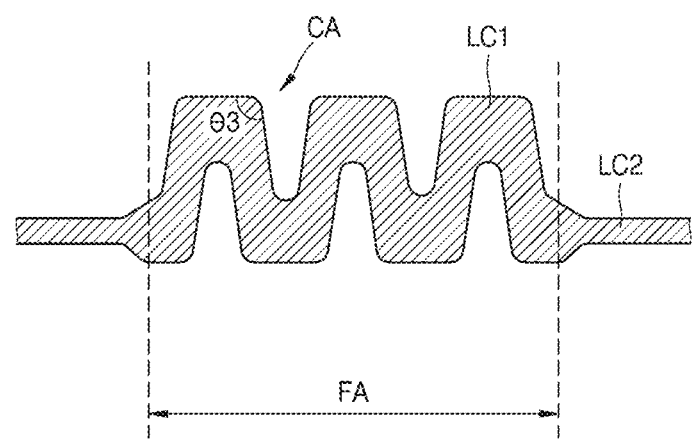

In an embodiment, as illustrated in FIG. 14A, the loop coil LC may have a linear shape in the non-folding area NFA and a zigzag shape in the folding area FA. That is, the first portion LC1 of the loop coil LC may have a zigzag shape, and the second portion LC2 may have a linear shape. Also, in this case, a thickness of the first portion LC1 of the loop coil LC may be less than a thickness of the second portion LC2 thereof, and a width of the first portion LC1 may be greater than a width of the second portion LC2. The zigzag shape of the loop coil LC may be modified in various manners. In an embodiment, a bending portion CA of the loop coil LC may be bent at an acute angle (81) as illustrated in FIG. 14A, at an angle (82) of 90 degrees, as illustrated in FIG. 14B, or at an obtuse angle (83) as illustrated in FIG. 14C, for example. Corners of the bending portion CA may be round as illustrated in FIGS. 14B and 14C.

Figure 14D:
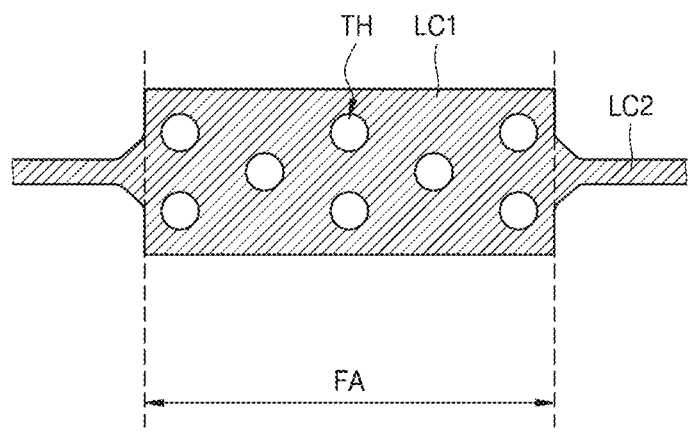
Figure 14E:
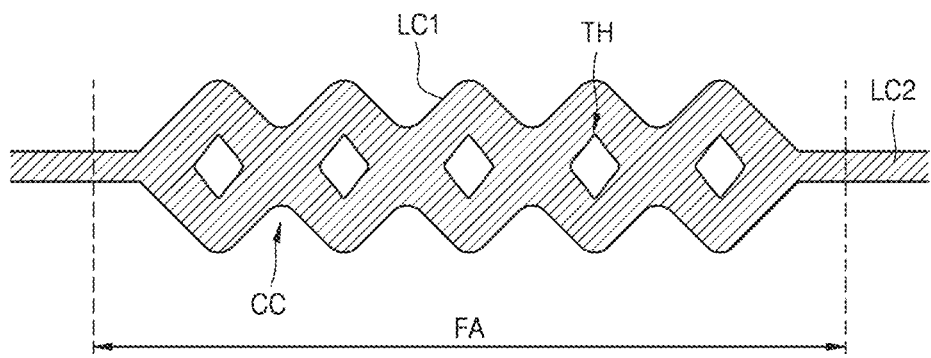

In an embodiment, as illustrated in FIG. 14D, a plurality of through holes TH may be defined in the loop coil LC in the folding area FA. That is, the through holes TH may be defined linearly in the first portion LC1 of the loop coil LC in an extension direction thereof. As illustrated in FIG. 14E, the first portion LC1 of the loop coil LC may have a concave portion CC between the through holes TH. Also, in this case, a thickness of the first portion LC1 of the loop coil LC may be less than a thickness of the second portion LC2 thereof, and a width of the first portion LC1 may be greater than a width of the second portion LC2.

Figure 15:
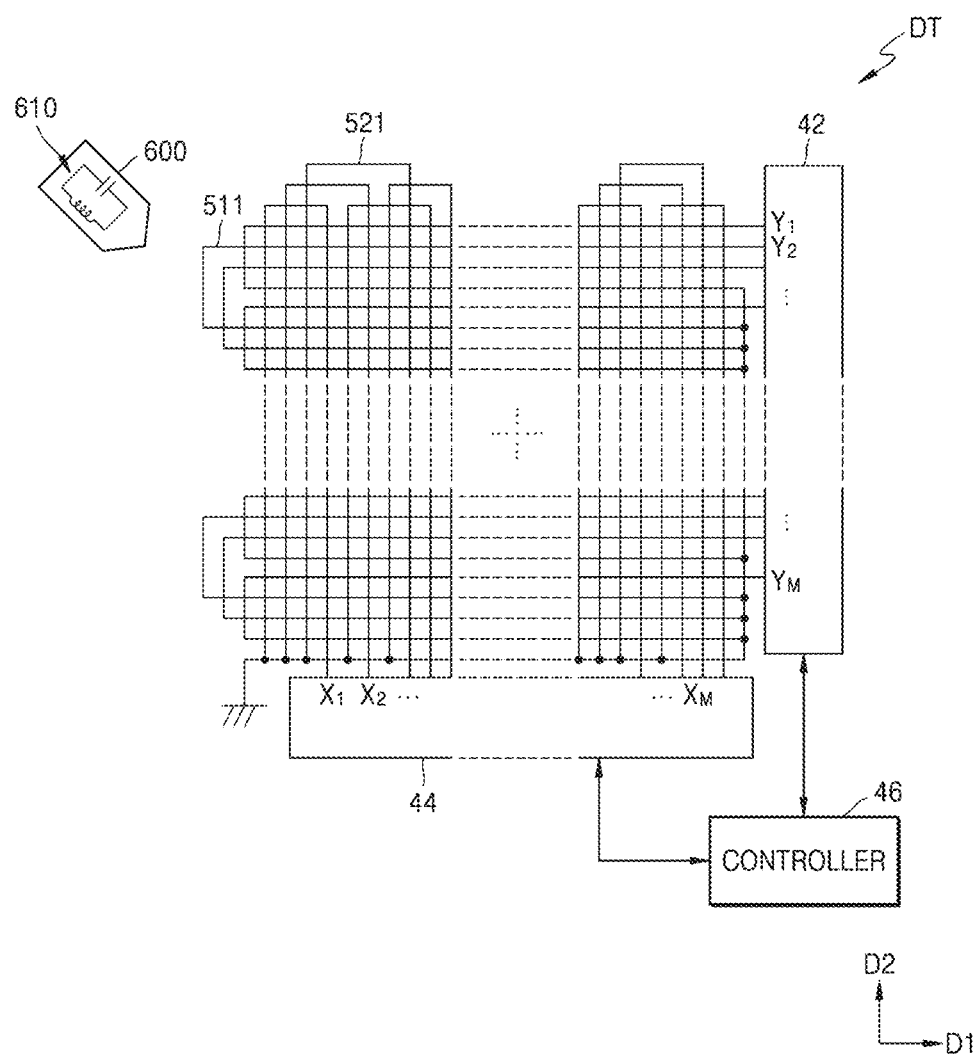
FIG. 15 is a schematic diagram of an embodiment of a digitizer.
Figure 16:
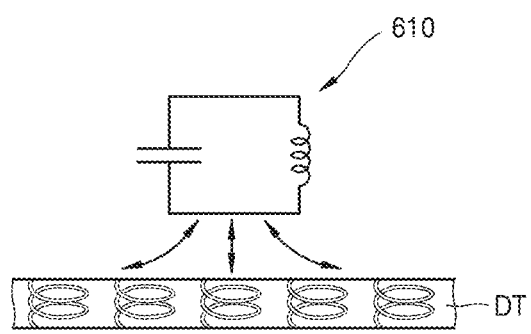
FIG. 16 is a view schematically illustrating driving of a digitizer.

FIG. 15 is a schematic diagram of an embodiment of a digitizer. FIG. 16 is a view schematically illustrating driving of a digitizer.

Referring to FIG. 15, a digitizer DT may include first loop coils 511 arranged in a second direction D2 and second loop coils 521 arranged in a first direction D1. The digitizer DT may further include a first selection driver 42, a second selection driver 44, and a controller 46.

The controller 46 may output a control signal controlling a loop coil selection operation of the first selection driver 42 and the second selection driver 44 and sequentially provide an alternating current ("AC") signal having a predetermined frequency to each loop coil.

The first selection driver 42 may sequentially select the first loop coils 511 $Y_1$ through $Y_M$ (M is a natural number), and the second selection driver 44 may sequentially select the second loop coils 521 $X_1$ through $X_M$, thus forming a magnetic field according to an AC signal, in each of the first loop coils 511 and the second loop coils 521.

Referring to FIG. 16 together, an input unit 600 may include a resonance circuit 610, and an inductive magnetic field is generated in the input unit 600 by a magnetic field transmitted from a loop coil, and the digitizer DT may detect the inductive magnetic field via the loop coil to thereby detect a position, pen pressure, and a height of the input unit 600.

The input unit 600 may generate an electromagnetic signal and output the same to the outside. The input unit 600 illustrated in FIG. 15 is an embodiment and may be any device that outputs an electromagnetic signal without limitation.

Figure 17:
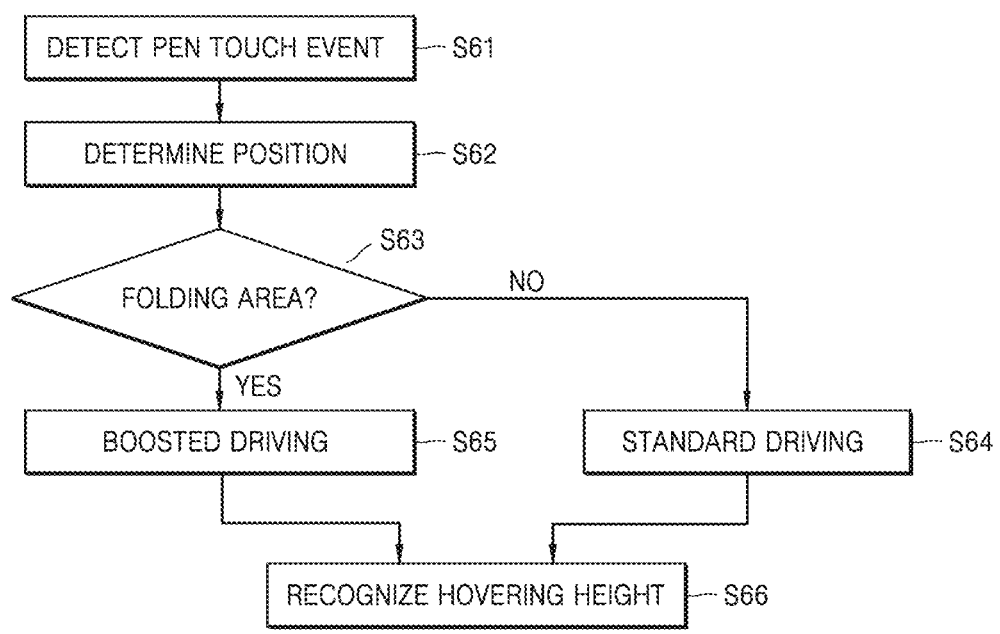
FIG. 17 is a flowchart of an embodiment of driving of a digitizer.
Figure 18:
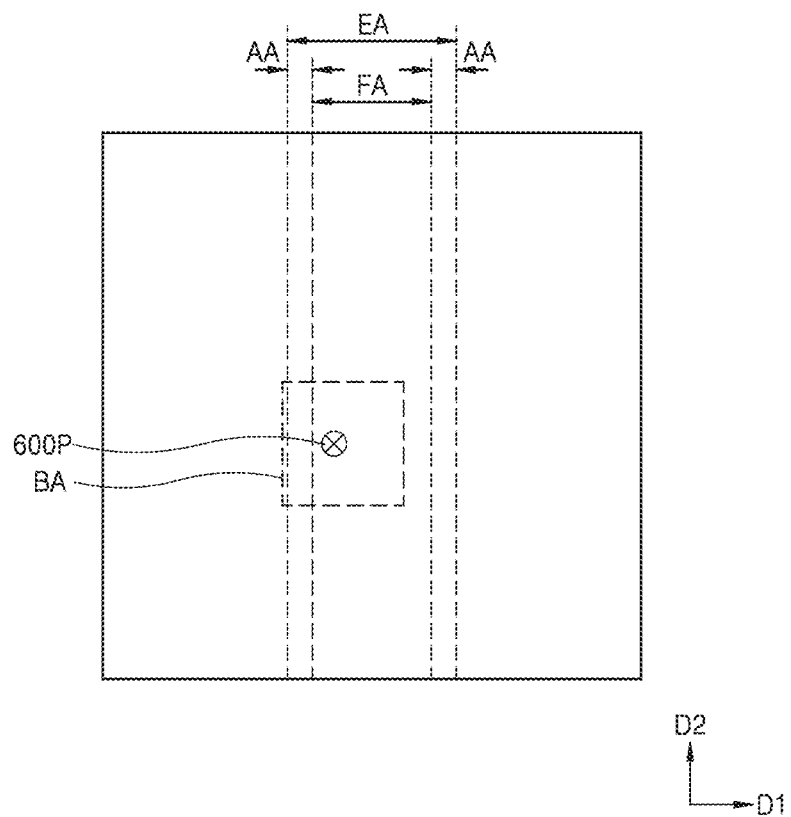
FIG. 18 is a diagram for describing an embodiment of an extension of a folding area.

FIG. 17 is a flowchart of an embodiment of driving of a digitizer. FIG. 18 is a diagram for describing an embodiment of an extension of a folding area. FIG. 17 may be a hovering event detecting method by a digitizer.

Referring to FIG. 17, when a pen touch event is detected (S61), the digitizer DT may detect a position of the input unit 600 (S62). The pen touch event may include a direct touch event and an indirect touch event.

The digitizer DT may determine whether a position of the input unit 600 is in the folding area FA (S63). In an embodiment, in the case of an indirect touch event, the digitizer DT may determine whether the input unit 600 is in the folding area FA. When the input unit 600 is in the folding area FA, for example, the input unit 600 may be in the folding area FA or at least a portion of the input unit 600 may be in the folding area FA.

When the input unit 600 is in the non-folding area NFA, the digitizer DT may convert into a standard driving mode (S64) and detect a height to a pen point of the input unit 600 (hereinafter, 'hovering height') from a surface of the display device in the standard driving mode (S66). The standard driving mode may be a mode in which a constant alternating current voltage is applied to loop coils in the folding area FA and the non-folding area NFA of the digitizer DT.

When the input unit 600 is in the folding area FA, the digitizer DT may convert into a boosted driving mode (S65) and detect a hovering height in the boosted driving mode (S66). The boosted driving mode may be a mode in which an intensity of an alternating current voltage applied to loop coils arranged in an extended folding area EA extended from the folding area FA of the digitizer DT by a predetermined area AA on the left and right, as illustrated in FIG. 18, is increased. In an embodiment, a width of the area AA may correspond to a diameter of a tip of the pen point of the input unit 600. In an embodiment, a width of the folding area FA in a second direction D2 may be about 8 millimeter (mm), and a width of the area AA may be 1 mm, and a width of the extended folding area EA may be about 10 mm.

In an embodiment, when the input unit 600 is in the extended folding area EA, the digitizer DT may increase, to a preset value, an alternating current voltage applied to at least one loop coil arranged in a boosted area BA, for example. The boosted area BA is an area extended by a predetermined range from a position 600P of the input unit 600, within the extended folding area EA.

A position and height of the input unit 600 may be detected using a change in a magnetic field detected between the input unit 600 and loop coils. In an embodiment, the digitizer DT may detect a change in a magnetic field between the input unit 600 and loop coils that are directly under the input unit 600 and loop coils around the input unit 600, and determine a hovering position and height based on interpolation of detected values. When a hovering event occurs, a position and height of the input unit 600 may be accurately detected by a signal boosting in the folding area FA.

The digitizer DT may correct the height of the input unit 600, which is detected in boosted driving mode, according to a preset algorithm.

In an embodiment of the invention, a foldable display device including a digitizer capable of detecting an accurate position of an input unit may be provided. However, these objectives are just examples, and the scope of the invention is not limited thereby.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein without departing from the spirit and scope as defined by the following claims.

What is claimed is:

1. A display device including a folding area and a non-folding area, the display device comprising:
    a display panel comprising a plurality of pixels; and
    a digitizer arranged at one side of the display panel and comprising a plurality of loop coils,
    wherein, when a hovering event of an input unit is detected in the folding area, the digitizer increases an alternating current signal applied to at least one loop coil of the plurality of loop coils arranged in the folding area, and calculates a hovering height of the input unit based on a change in a magnetic field between the input unit and loop coils of the plurality of loop coils, the loop coils including a loop coil overlapping the input unit and adjacent loop coils around the input unit.

2. The display device of claim 1, wherein the plurality of loop coils has a first width and a first thickness in the folding area and a second width and a second thickness in the non-folding area, the second width being less than the first width, and the second thickness being greater than the first thickness.

3. The display device of claim 2, wherein each of the plurality of loop coils has a linear shape.

4. The display device of claim 2, wherein each of the plurality of loop coils has a zigzag shape.

5. The display device of claim 4, wherein each of the plurality of loop coils has a linear shape in the non-folding area and a zigzag shape in the folding area.

6. The display device of claim 1, wherein a plurality of through holes are defined in the plurality of loop coils in the folding area.

7. The display device of claim 1, wherein the plurality of loop coils includes a first portion corresponding to the folding area and a second portion corresponding to the non-folding area, and an end portion of the first portion contacts an end portion of the second portion.

8. The display device of claim 7, wherein the end portion of the first portion of the plurality of loop coils overlaps above the end portion of the second portion.

9. The display device of claim 7, wherein the end portion of the first portion of the plurality of loop coils overlaps under the end portion of the second portion.

10. The display device of claim 1, wherein the plurality of loop coils includes a first portion corresponding to the folding area and a second portion corresponding to the non-folding area, and the first portion and the second portion are provided as a single body.

11. The display device of claim 1, wherein, when a hovering event of the input unit is detected in the folding area, the digitizer extends the folding area.

12. The display device of claim 11, wherein the digitizer increases an alternating current voltage applied to at least one loop coil of the plurality of loop coils arranged in the extended folding area.

13. The display device of claim 11, wherein the digitizer increases an alternating current voltage applied to at least one loop coil of the plurality of loop coils arranged within a range from a position of the input unit in the extended folding area.

14. A display device including a folding area and a non-folding area, the display device comprising
    a digitizer comprising a plurality of loop coils, wherein the plurality of loop coils has a first width and a first thickness in the folding area and a second width and a second thickness in the non-folding area, the second width being less than the first width, and the second thickness being greater than the first thickness,
    wherein, when a hovering event of an input unit is detected in the folding area, the digitizer increases an alternating current signal applied to at least one loop coil of the plurality of loop coils arranged in the folding area.

15. The display device of claim 14, wherein each of the plurality of loop coils has a linear shape.

16. The display device of claim 14, wherein each of the plurality of loop coils has a zigzag shape.

17. The display device of claim 16, wherein each of the plurality of loop coils has a linear shape in the non-folding area and a zigzag shape in the folding area.

18. The display device of claim 14, wherein a plurality of through holes are defined in the plurality of loop coils in the folding area.

19. The display device of claim 14, wherein, when a hovering event of the input unit is detected in the folding area, the digitizer extends the folding area, and the digitizer increases an alternating current voltage applied to at least one loop coil of the plurality of loop coils arranged in the extended folding area.

20. The display device of claim 19, wherein the digitizer increases an alternating current voltage applied to at least one loop coil of the plurality of loop coils arranged within a range from a position of the input unit in the extended folding area.

* * * * *